United States Patent
Baliga

(10) Patent No.: US 11,276,779 B1
(45) Date of Patent: Mar. 15, 2022

(54) POWER MOSFET AND JBSFET CELL TOPOLOGIES WITH SUPERIOR HIGH FREQUENCY FIGURE OF MERIT

(71) Applicant: North Carolina State University, Raleigh, NC (US)

(72) Inventor: Bantval Jayant Baliga, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 11 days.

(21) Appl. No.: 17/014,368

(22) Filed: Sep. 8, 2020

Related U.S. Application Data

(63) Continuation of application No. 16/434,713, filed on Jun. 7, 2019, now Pat. No. 10,804,393, which is a continuation of application No. 15/925,826, filed on Mar. 20, 2018, now Pat. No. 10,355,132.

(60) Provisional application No. 62/624,989, filed on Feb. 1, 2018, provisional application No. 62/526,192, filed on Jun. 28, 2017, provisional application No. 62/473,761, filed on Mar. 20, 2017.

(51) Int. Cl.

| | |
|---|---|
| *H01L 29/78* | (2006.01) |
| *H01L 29/16* | (2006.01) |
| *H01L 29/423* | (2006.01) |
| *H01L 29/812* | (2006.01) |
| *H01L 29/08* | (2006.01) |
| *H01L 29/66* | (2006.01) |

(52) U.S. Cl.
CPC ...... *H01L 29/7836* (2013.01); *H01L 29/1608* (2013.01); *H01L 29/42376* (2013.01); *H01L 29/6656* (2013.01); *H01L 29/6659* (2013.01); *H01L 29/66666* (2013.01); *H01L 29/7827* (2013.01); *H01L 29/0891* (2013.01); *H01L 29/7811* (2013.01); *H01L 29/7823* (2013.01); *H01L 29/812* (2013.01); *H01L 2924/13063* (2013.01)

(58) Field of Classification Search
CPC ............. H01L 29/7836; H01L 29/1608; H01L 29/42376; H01L 29/7827; H01L 29/7811; H01L 29/7823; H01L 29/812; H01L 29/0891; H01L 29/095; H01L 2924/13063
See application file for complete search history.

(56) References Cited

U.S. PATENT DOCUMENTS

| | | | |
|---|---|---|---|
| 4,994,904 | A | 2/1991 | Nakagawa et al. |
| 5,262,668 | A | 11/1993 | Tu et al. |
| 5,349,212 | A | 9/1994 | Seki |

(Continued)

*Primary Examiner* — Ida M Soward
(74) *Attorney, Agent, or Firm* — Myers Bigel, P.A.

(57) ABSTRACT

A vertical insulated-gate field effect transistor includes a semiconductor substrate and a gate electrode on a first surface thereof. This gate electrode has a plurality of eight (or more) sided openings extending therethrough. Each of these openings has eight (or more) sidewalls, including a first plurality of sidewalls that are flat relative to a center of the opening and second plurality of sidewalls that are either flat or concave relative to the center of the opening. A source electrode is also provided, which extends into the openings. This source electrode may ohmically contact a source region within the semiconductor substrate. If the field effect transistor is a JBSFET, the source electrode may also form a Schottky rectifying junction with a drift region within the semiconductor substrate.

26 Claims, 6 Drawing Sheets

(56) References Cited

U.S. PATENT DOCUMENTS

| | | | |
|---|---|---|---|
| 5,703,390 | A | 12/1997 | Itoh |
| 7,230,299 | B2 | 6/2007 | Robb et al. |
| 7,235,857 | B2 | 6/2007 | Majumdar et al. |
| 7,556,994 | B2 | 7/2009 | Sankin et al. |
| 7,863,685 | B2 | 1/2011 | Hshieh |
| 7,919,824 | B2 | 4/2011 | Ono et al. |
| 7,982,239 | B2 | 7/2011 | Mcnutt et al. |
| 8,013,360 | B2 | 9/2011 | Saito et al. |
| 8,378,427 | B2 | 2/2013 | Chen |
| 8,546,874 | B2 | 10/2013 | Hefner et al. |
| 9,281,392 | B2 | 3/2016 | Weyers et al. |
| 9,577,046 | B1 | 2/2017 | Hori et al. |
| 9,735,769 | B1 | 8/2017 | Titus |
| 9,947,741 | B2 | 4/2018 | Schulze et al. |
| 10,109,725 | B2 | 10/2018 | Storasta et al. |
| 2004/0262677 | A1 * | 12/2004 | Harada .............. H01L 29/7813 257/329 |
| 2010/0007782 | A1 | 1/2010 | Segami et al. |
| 2010/0244047 | A1 | 9/2010 | Hull et al. |
| 2013/0248988 | A1 * | 9/2013 | Ono .................... H01L 29/0696 257/330 |
| 2013/0334597 | A1 * | 12/2013 | Yamashita ........ H01L 29/42376 257/334 |
| 2014/0145245 | A1 * | 5/2014 | Harrington, III ........................... H01L 29/42376 257/255 |
| 2014/0284701 | A1 | 9/2014 | Korec |
| 2015/0069417 | A1 | 3/2015 | Ryu |
| 2015/0162432 | A1 | 6/2015 | Kumagai |
| 2015/0333177 | A1 | 11/2015 | Zhang et al. |
| 2016/0005883 | A1 * | 1/2016 | Yen .................... H01L 21/0495 257/77 |
| 2016/0064548 | A1 * | 3/2016 | Laforet ................ H01L 29/404 257/331 |
| 2017/0148871 | A1 | 5/2017 | Kocon et al. |
| 2017/0194438 | A1 | 7/2017 | Kumagai et al. |
| 2018/0019309 | A1 | 1/2018 | Radhakrishnan et al. |
| 2018/0166530 | A1 | 6/2018 | Lichtenwalner et al. |

* cited by examiner

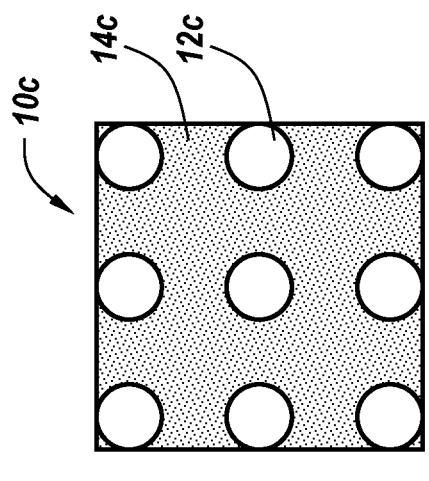
Fig. 1A (Prior Art)
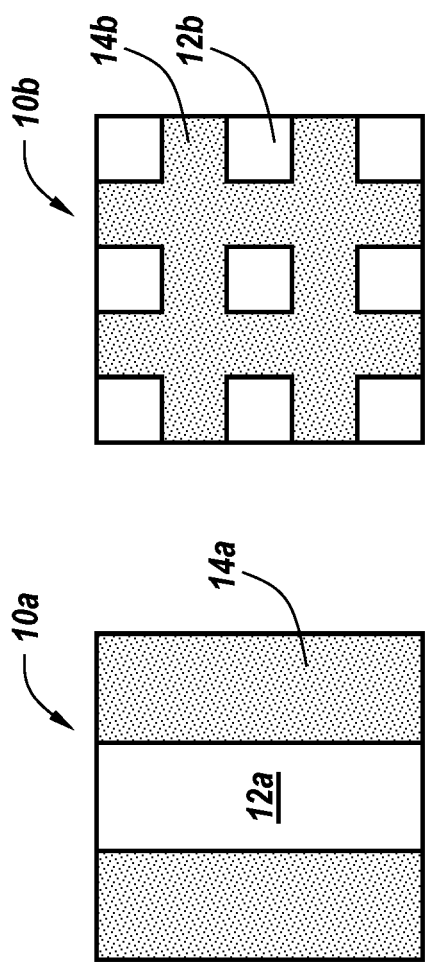
Fig. 1B (Prior Art)
Fig. 1C (Prior Art)
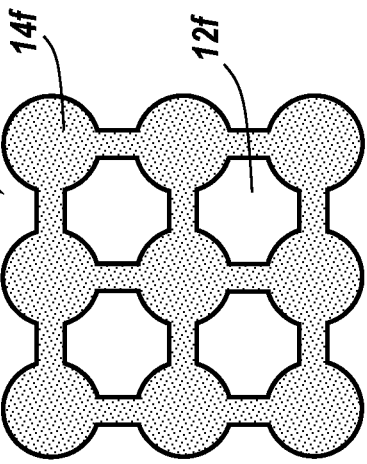
Fig. 1D (Prior Art)
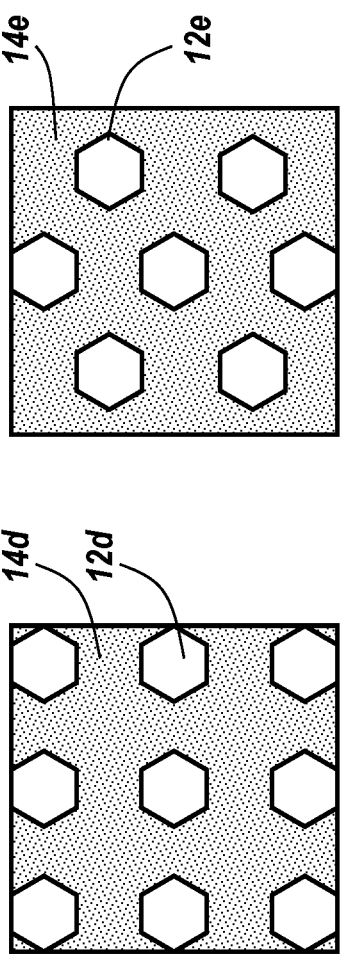
Fig. 1E (Prior Art)
Fig. 1F (Prior Art)

US 11,276,779 B1

POWER MOSFET AND JBSFET CELL TOPOLOGIES WITH SUPERIOR HIGH FREQUENCY FIGURE OF MERIT

REFERENCE TO PRIORITY APPLICATIONS

This application claims priority to U.S. application Ser. No. 16/434,713, filed Jun. 7, 2019, now U.S. Pat. No. 10,804,393, which claims priority to U.S. application Ser. No. 15/925,826, filed Mar. 20, 2018, now U.S. Pat. No. 10,355,132, which claims priority to: U.S. Provisional Application Ser. No. 62/624,989, filed Feb. 1, 2018, U.S. Provisional Application Ser. No. 62/526,192, filed Jun. 28, 2017, and U.S. Provisional Application Ser. No. 62/473,761, filed Mar. 20, 2017, the disclosures of which are hereby incorporated herein by reference.

STATEMENT OF GOVERNMENT INTEREST

This invention was made with government support under grant number DE-EE0006521 awarded by the Department of Energy. The government has certain rights to this invention.

FIELD OF THE INVENTION

The present invention relates to semiconductor switching devices and, more particularly, to field effect transistors for high power applications.

BACKGROUND OF THE INVENTION

Planar-gate field effect transistors, such as silicon and silicon carbide (SiC) MOSFETs, have been manufactured with unit cell designs having a variety of gate topologies. The most commonly manufactured topology is the linear gate topology 10a illustrated by FIG. 1A, which provides a linear window 12a within a planar polysilicon gate electrode 14a. Other conventional gate topologies 10b-10e include the: (i) square window 12b within "square array" polysilicon gate electrode 14b, (ii) circular window 12c within "square array" polysilicon gate electrode 14c, (iii) hexagonal window 12d within "square array" polysilicon gate electrode 14d, and (iv) hexagonal window 12e within "hexagonal array" polysilicon gate electrode 14e, as illustrated by FIGS. 1B-1E, respectively. In addition, as illustrated by FIG. 1F, an atomic lattice layout (ALL) topology 10f with multi-sided (e.g., convex and straight) openings 12f within a polysilicon gate electrode 14f has been proposed to achieve improvements in safe-operating-area (SOA) of silicon insulated-gate bipolar transistors (IGBTs), but has also been used as a topology for silicon power MOSFETs.

Each of these conventional gate topologies 10a-10f can be characterized by a respective channel density and source contact area. As will be understood by those skilled in the art, channel density is defined as the channel width per unit area of the active area. A larger channel width is desirable to reduce the contribution of the channel resistance to total specific on-resistance. The source contact area is also typically a small fraction of the overall cell area, which means the contribution of the source contact resistance to the total specific on-resistance can be significant.

SUMMARY OF THE INVENTION

Vertical insulated-gate field effect transistors according to some embodiments of the invention may be configured to operate as power MOSFETs and junction barrier Schottky FETs (JBSFETs), which support high channel density, low contact resistance, low specific on-resistance and high frequency switching resulting from reduced gate-to-drain overlap. In some of these embodiments, a vertical insulated-gate field effect transistor is provided, which includes a semiconductor substrate and a gate electrode on a first surface of the semiconductor substrate. This gate electrode may have a plurality of eight (or more) sided openings extending therethrough. Each of these openings has eight (or more) sidewalls, including a first plurality of sidewalls that are flat relative to a center of the opening and second plurality of sidewalls that are either flat or concave relative to the center of the opening. For example, in some of these embodiments, all of the eight (or more) sidewalls of an opening may be flat relative to a corresponding center, and possibly even define an octagon with equivalent length sides. Alternatively, the eight sidewalls may include four flat sidewalls having a first length and four flat sidewalls having a second length, which is shorter than the first length. A source electrode is also provided, which extends into the openings. This source electrode may ohmically contact a source region of first conductivity type (e.g., N-type) within the semiconductor substrate. If the field effect transistor is a JBSFET, the source electrode may also form a Schottky rectifying junction with a drift region of first conductivity type within the semiconductor substrate. According to additional embodiments of the invention, the gate electrode, which may span a two-dimensional array of transistor unit cells, may be configured as one or more quad-arrangements of four generally octagon-shaped gate electrode regions, which are electrically connected together by four generally rectangular-shaped gate electrode "connecting" regions.

According to additional embodiments of the invention, a vertical insulated-gate field effect transistor may include a semiconductor substrate and a gate electrode (e.g., polysilicon gate) on a first surface of the semiconductor substrate. This gate electrode may have an at least eight-sided opening extending therethrough, which defines at least eight sidewalls thereof that are flat or concave relative to a center of the opening. A source electrode is also provided, which extends into the opening in the gate electrode. In some of these embodiments, the at least eight sidewalls includes a plurality of arcuate-shaped sidewalls, which are concave relative to the center of the opening. Preferably, the centers of these plurality of arcuate-shaped sidewalls are spaced-apart from the center of the opening. In additional embodiments of the invention, the insulated-gate field effect transistor may be configured as a JBSFET having a four-sided Schottky rectifying contact within an octagonal-shaped or an at least eight-side opening in the gate electrode.

According to further embodiments of the invention, a field effect transistor may be configured as a silicon carbide (SiC) power device, which includes a silicon carbide substrate and a two-dimensional (2D) array of vertical insulated-gate field effect transistor unit cells (IGFETs) in the silicon carbide substrate. The 2D array of IGFETs may be configured to have a contiguous gate electrode that spans the IGFETs therein, with each of the IGFETs having: (i) a lateral rectangular dimension of L×W, and (ii) a corresponding eight-sided (or more) opening extending through the contiguous gate electrode, where L is a length of an IGFET and W is a width of an IGFET as measured along a surface of the silicon carbide substrate, and where each sidewall of each at least eight-sided opening is flat or concave relative to a center of its corresponding opening. A source electrode is also provided, which extends into the openings in the contiguous gate electrode. According to some of these embodiments of the invention, an area (A) of each of the openings in the contiguous gate electrodes is preferably equivalent to: $0.1(L \times W) \leq A \leq 0.3(L \times W)$. Likewise, in the event each of the IGFETs is configured as a JBSFET, an area (A) of each of the openings in the contiguous gate electrodes may be equivalent to: $0.1(L \times W) \leq A \leq 0.3(L \times W)$.

In still further embodiments of the invention, a monolithically-integrated AC switch is provided, which includes a semiconductor substrate having first and second insulated-gate field effect transistors (IGFETs) therein. These first and second IGFETs include first and second spaced-apart and independently-controllable source terminals extending adjacent a first surface of the semiconductor substrate. A common drain electrode is also provided, which extends adjacent a second surface of the semiconductor substrate. The first and second IGFETs also include first and second gate electrodes on the first surface of the semiconductor substrate, with the first gate electrode having an at least eight-sided first opening extending therethrough, which receives a portion of the first source terminal therein. This at least eight-sided first opening is preferably defined by eight (or more) sidewalls, with each of these sidewalls being flat or concave relative to a center of the first opening. In some of these embodiments of the invention, the second gate electrode may also have an at least eight-sided second opening extending therethrough, which receives a portion of the second source terminal therein. And, this second opening may be defined by eight (or more) sidewalls, with each of these sidewalls being flat or concave relative to a center of the second opening.

BRIEF DESCRIPTION OF THE DRAWINGS

FIG. 1A is a plan view of a portion of a planar-gate silicon carbide (SiC) MOSFET having a linear window in linear array topology, according to the prior art.

FIG. 1B is a plan view of a portion of a planar-gate silicon carbide (SiC) MOSFET having a square window in square array topology, according to the prior art.

FIG. 1C is a plan view of a portion of a planar-gate silicon carbide (SiC) MOSFET having a circular window in square array topology, according to the prior art.

FIG. 1D is a plan view of a portion of a planar-gate silicon carbide (SiC) MOSFET having a hexagonal window in square array topology, according to the prior art.

FIG. 1E is a plan view of a portion of a planar-gate silicon carbide (SiC) MOSFET having a hexagonal window in hexagonal array topology, according to the prior art.

FIG. 1F is a plan view of a portion of a planar-gate silicon carbide (SiC) MOSFET having an atomic lattice layout (ALL) topology, according to the prior art.

DETAILED DESCRIPTION OF EMBODIMENTS

Figure 2A:
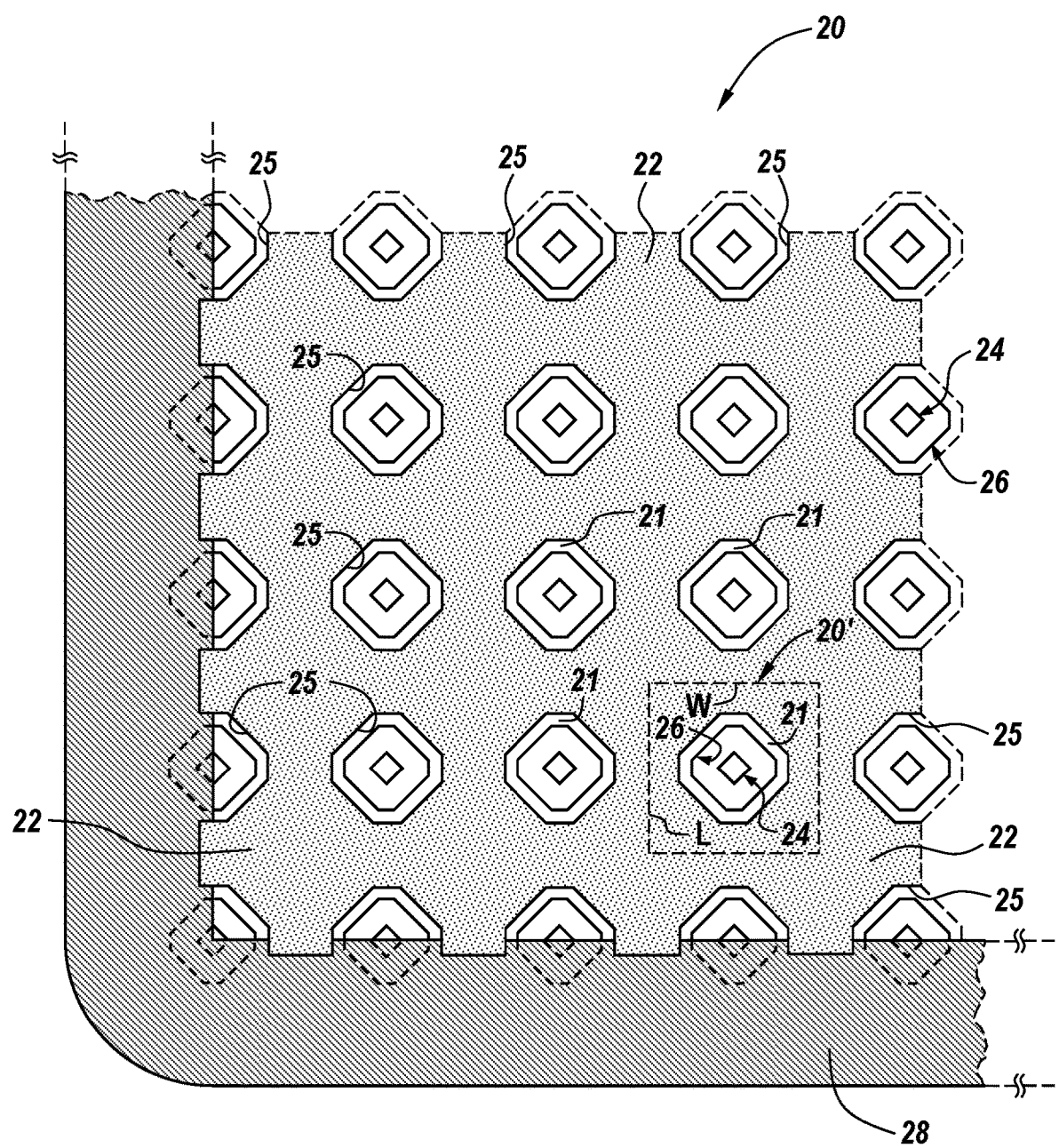
FIG. 2A is a plan view of a portion of a planar-gate field effect transistor according to an embodiment of the invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2B:
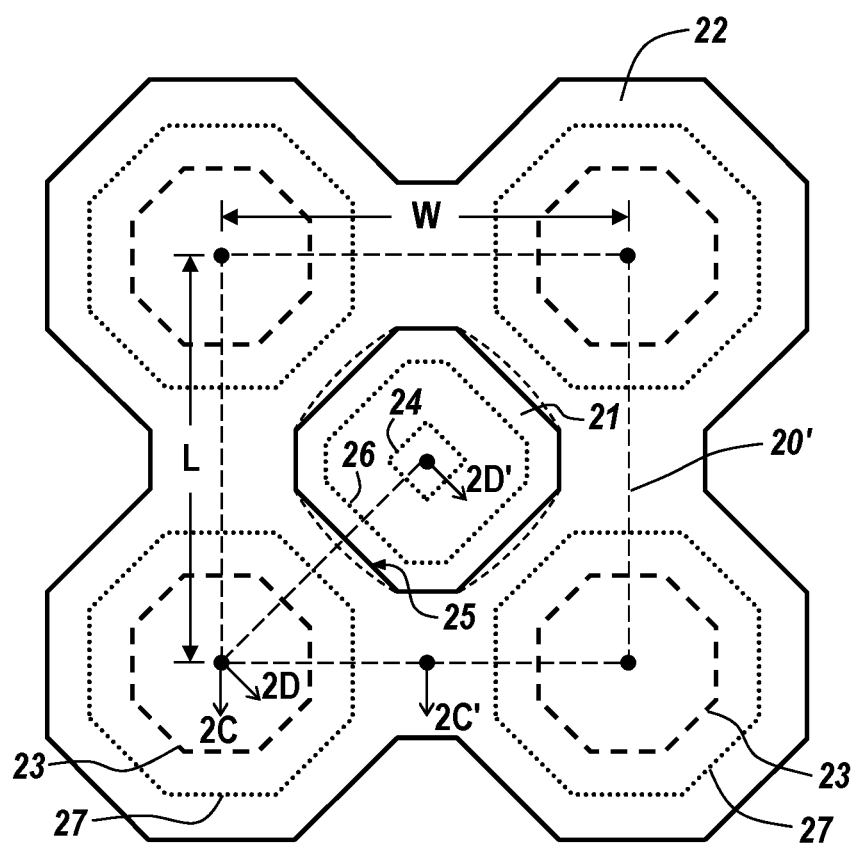
FIG. 2B is a plan view of highlighted portion of the planar-gate field effect transistor of FIG. 2A, including a unit cell therein.

Referring now to FIGS. 2A-2B, a plan view of a "corner" portion of a planar-gate field effect transistor 20 (e.g., SiC power MOSFET) for high current/power applications is illustrated as including a two-dimensional array of unit cells 20' therein having a shared planar gate electrode 22 (e.g., polysilicon) on a primary surface (e.g., top surface) of an underlying semiconductor substrate (e.g., semiconductor chip). This two-dimensional array of unit cells 20' is surrounded by an edge termination region 28 (e.g., P+ surface termination diffusion region), which typically extends adjacent a four-sided outer periphery of the semiconductor substrate.

As highlighted, each unit cell 20' has a rectangular shape (width=W, length=L) and includes a corresponding gate electrode "cell" region having a single centrally-located opening 21 therein. Each opening 21 may be an eight (or more) sided opening 21 defined by a corresponding eight (or more) gate electrode sidewalls 25 (e.g., polysilicon sidewalls). Each of these sidewalls 25 may be flat in plan view, as shown, or possibly concave relative to a corresponding center of an opening 21 as shown by dotted line arcs in FIGS. 2B and 3A. Accordingly, one or more of the sidewalls 25 of the opening 21 may be a flat/planar sidewall and one or more of the sidewalls may be a concave-shaped arc, with each concave-shaped arc having a respective radius of curvature about a respective center, which is offset relative to a center of the opening 21. Thus, the sidewalls 25 may include exclusively flat or exclusively concave sidewalls, or various combinations of eight or more flat and concave sidewalls of varying lengths. In addition, when viewed from a plan perspective (i.e., top-down layout perspective), each sidewall of an opening 21 intersects two adjacent sidewalls at respective vertices, such that two immediately adjacent flat sidewalls, if present, are not collinear, and two immediately adjacent concave sidewalls, if present, do not lie within a continuous arc extending through a connecting vertex. Thus, as illustrated and described herein, each sidewall of an opening 21 (21'), whether flat or concave, intersects two immediately adjacent sidewalls at respective vertices when the sidewalls are viewed from a plan perspective.

As further shown by FIGS. 2A-2B, each opening 21 within the shared planar gate electrode 22 includes a corresponding contact window 26 (e.g., source metal contact window), which is spaced from the sidewalls 25 of each opening 21 by a distance corresponding to a thickness of each sidewall insulating spacer (e.g., dielectric sidewall spacer), as illustrated more fully hereinbelow by FIG. 2D. In addition, within each contact window 26, reference numeral 24 specifies the rectangular dimensions of a boundary between a P+ plug and a surrounding N+ source, as shown by FIG. 2D. The lateral dimensions of the N+ source regions and P-base regions are also identified by reference numerals 27 and 23, respectively, as shown by the transistor unit cell cross-sections of FIGS. 2C-2D. As will be understood by those skilled in the art, reference numeral 23 identifies a masking boundary for ion implantation of the P-base and P+ shielding regions and reference numeral 27 identifies the masking boundary for the ion implantation of the N+ source region.

Figure 2C:
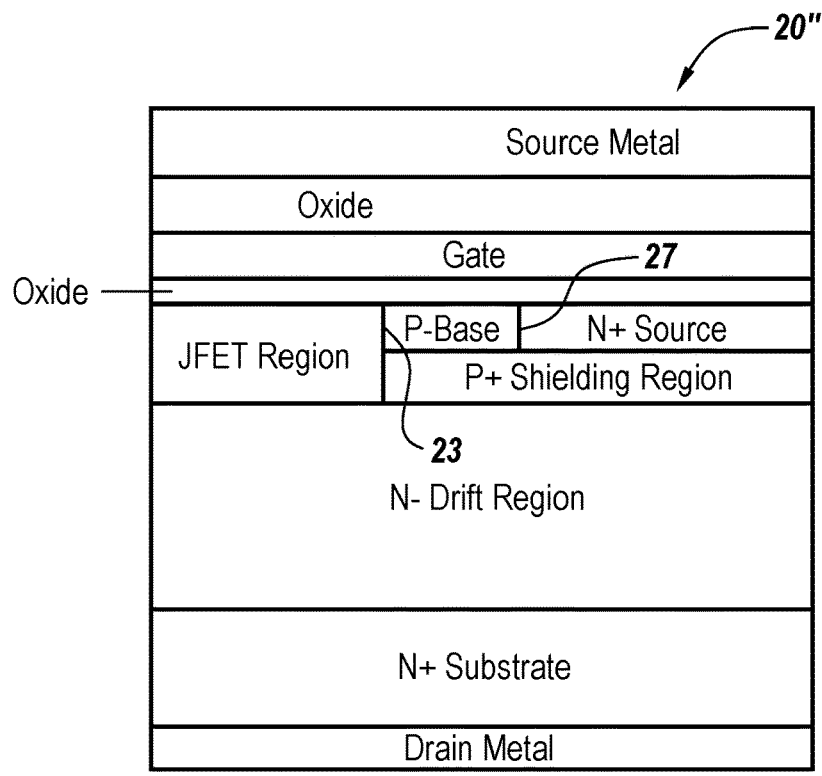
FIG. 2C is a cross-sectional view of the planar-gate field effect transistor of FIG. 2B, taken along line 2C-2C'.
Figure 2D:
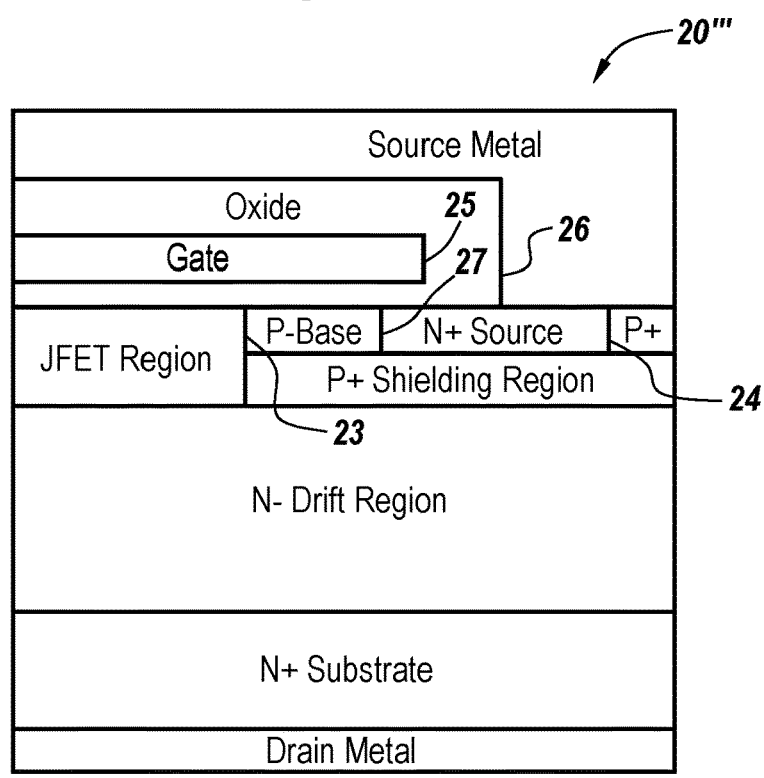
FIG. 2D is a cross-sectional view of the planar-gate field effect transistor of FIG. 2B, taken along line 2D-2D'.

In particular, FIG. 2C is a cross-sectional view 20" of the transistor unit cell 20' taken along line 2C-2C' and FIG. 2D is a cross-sectional view 20'" of the transistor unit cell 20' taken along line 2D-2D'. As shown by these figures, a semiconductor substrate is illustrated as including a conventional arrangement of a relatively lightly-doped (e.g., N−) semiconductor drift region on a relatively highly doped (e.g., N+) substrate layer. This substrate has an upper surface on which an insulated gate electrode and source electrode (i.e., source metal) are provided and a lower surface on which a drain electrode is provided. Multiple regions of N-type and P-type conductivity are formed in the drift region, adjacent the upper surface of the substrate. As illustrated, these regions include an JFET "neck" region (N-type), a highly doped P-type shielding region, and a P-base, N+ source and P+ plug on the shielding region. As will be understood by those skilled in the art, the vertical P+ plug provides a low resistance electrical connection between the shielding region and the source electrode.

Figure 3A:
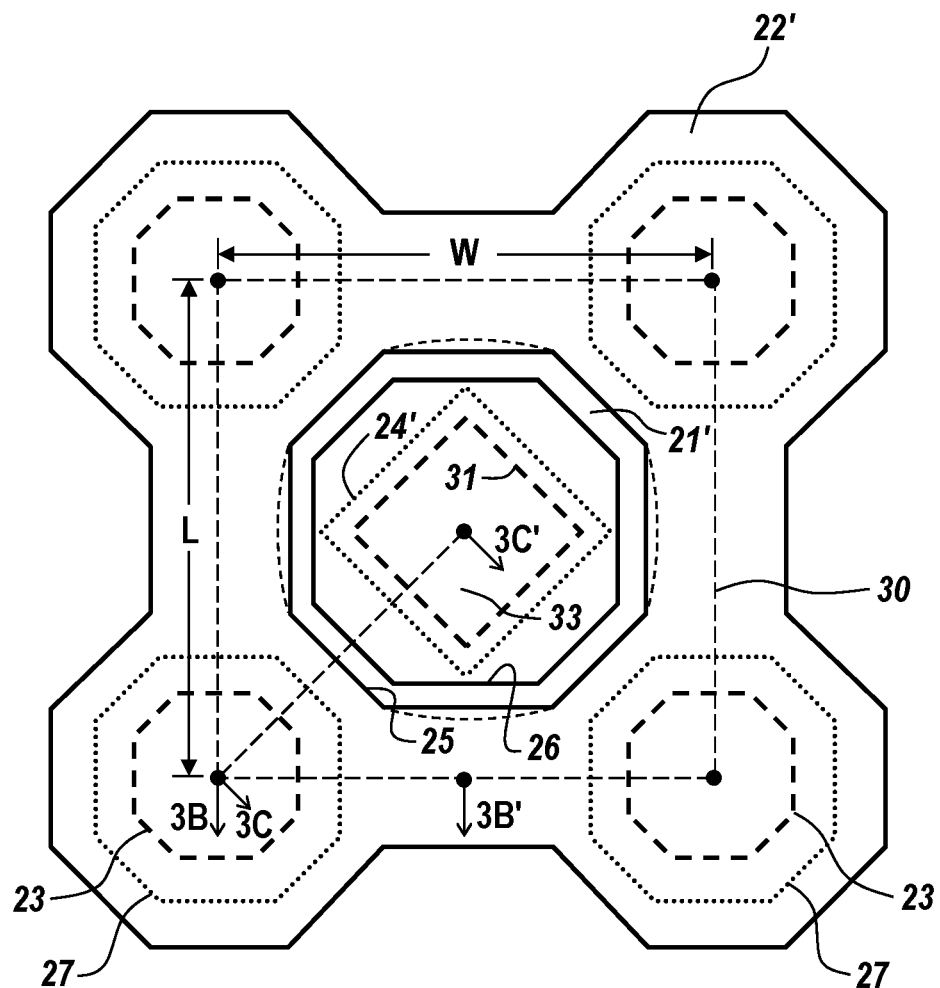
FIG. 3A is a plan view of planar-gate JBSFET, according to an embodiment of the present invention.
Figure 3B:
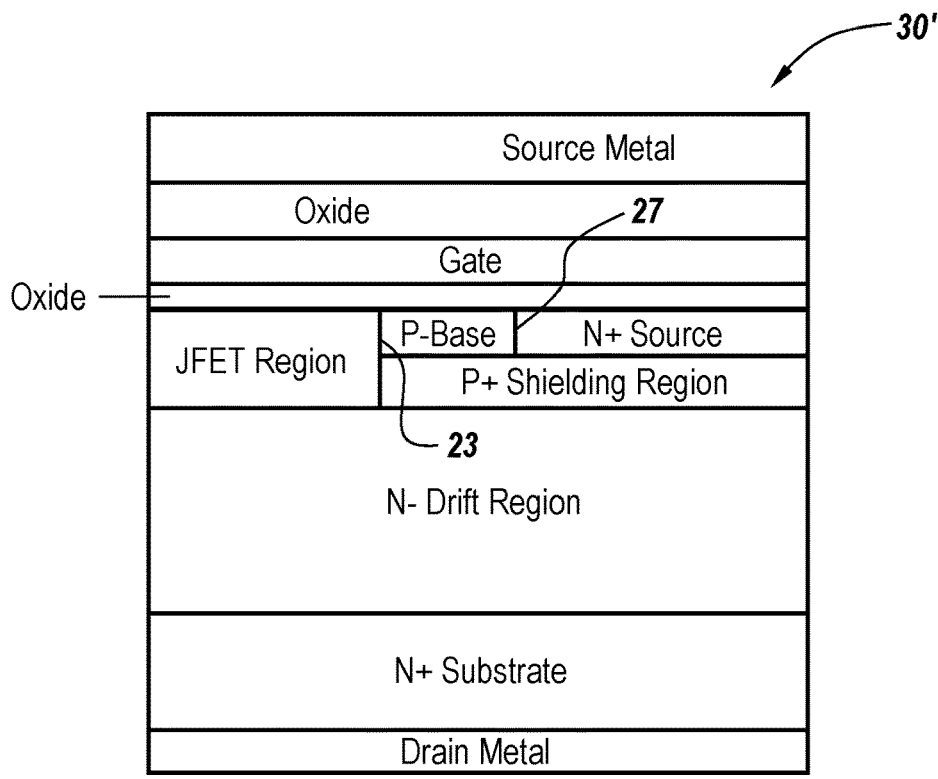
FIG. 3B is a cross-sectional view of the planar-gate JBSFET of FIG. 3A, taken along line 3B-3B'.
Figure 3C:
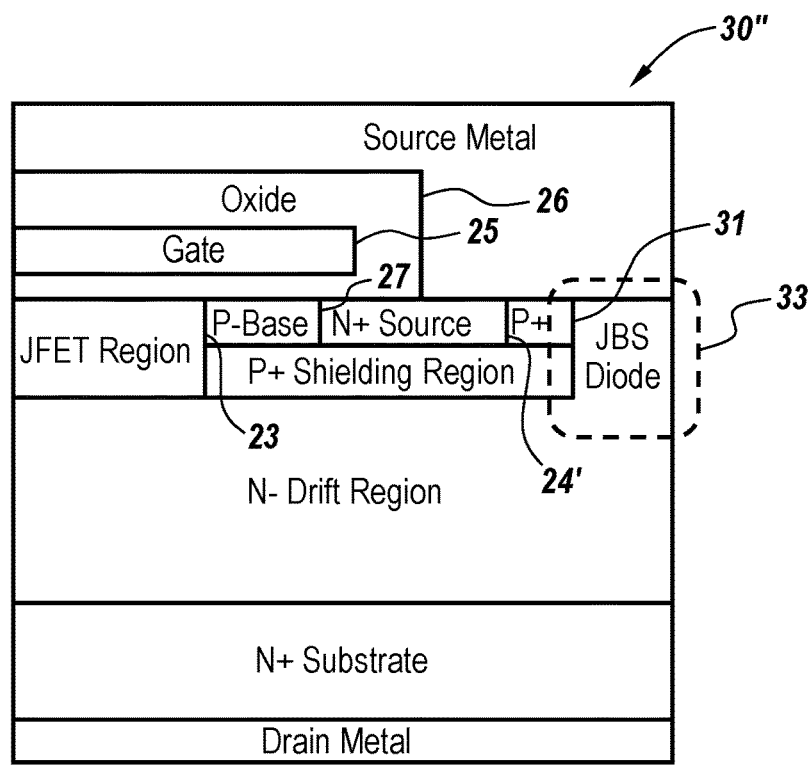
FIG. 3C is a cross-sectional view of the planar-gate JBSFET of FIG. 3A, taken along line 3C-3C'.

Referring now to FIGS. 3A-3C, a plan view of a planar-gate junction barrier Schottky field effect transistor (JBSFET) is illustrated as including a unit cell 30 having a planar gate electrode 22' (e.g., polysilicon) on a primary surface (e.g., top surface) of an underlying semiconductor substrate (e.g., semiconductor chip). This planar gate electrode 22' is illustrated as including four generally octagon-shaped gate electrode regions, which are electrically connected together by four generally rectangular-shaped gate electrode "connecting" regions. As will be understood by those skilled in the art, this unit cell 30 may be substituted for the unit cell 20' illustrated by FIG. 2A to thereby define a two-dimensional array of unit cells 30 within a planar-gate JBSFET for high current/power applications.

As highlighted, each unit cell 30 has a rectangular shape (width=W, length=L) and includes a corresponding gate electrode "cell" region having a single centrally-located opening 21' therein. Each opening 21' may be an eight (or more) sided opening 21' defined by a corresponding eight (or more) gate electrode sidewalls 25 (e.g., polysilicon sidewalls). Each of these sidewalls 25 may be flat in plan view, as shown in FIG. 3A, or concave relative to a corresponding center of an opening 21'. Accordingly, one or more of the sidewalls 25 of the opening 21' may be a flat/planar sidewall and one or more of the sidewalls may be a concave-shaped arc, with each concave-shaped arc having a respective radius of curvature about a respective center, which is offset relative to a center of the opening 21'. Thus, the sidewalls 25 may include exclusively flat or exclusively concave sidewalls, or various combinations of eight or more flat and concave sidewalls of varying lengths.

As further shown by FIGS. 3A-3C, each opening 21' within the shared planar gate electrode 22' includes a corresponding contact window 26 (e.g., source metal contact window), which is spaced from the sidewalls 25 of each opening 21' by a distance corresponding to a thickness of each sidewall insulating spacer (e.g., dielectric sidewall spacer), as illustrated more fully hereinbelow by FIG. 3C. In addition, within each contact window 26, reference numeral 24' specifies the rectangular dimensions of a boundary between a P+ plug and a surrounding N+ source, whereas reference numeral 31 defines the lateral dimensions of a Schottky rectifying contact between the source metal and the underlying N-type drift region, as shown by FIGS. 3A and 3C. These lateral dimensions of the Schottky rectifying contact can be varied to obtain a desired on-state voltage drop and low leakage current. The lateral dimensions of the N+ source regions and P-base regions are also identified by reference numerals 27 and 23, respectively, as shown by the transistor unit cell cross-sections of FIGS. 3B-3C.

In particular, FIG. 3B is a cross-sectional view 30' of the transistor unit cell 30 taken along line 3B-3B' and FIG. 3C is a cross-sectional view 30" of the transistor unit cell 30 taken along line 3C-3C'. As shown by these figures, a semiconductor substrate is illustrated as including a conventional arrangement of a relatively lightly-doped (e.g., N−) semiconductor drift region on a relatively highly doped (e.g., N+) substrate layer. This substrate has an upper surface on which an insulated gate electrode and source electrode are provided and a lower surface on which a drain electrode is provided. Multiple regions of N-type and P-type conductivity are formed in the drift region, adjacent the upper surface of the substrate. As illustrated, these regions include an JFET "neck" region (N-type), a highly doped P-type shielding region, and a P-base, N+ source and P+ plug on the shielding region. As will be understood by those skilled in the art, the vertical P+ plug provides a low resistance electrical connection between the shielding region and the source electrode.

In the drawings and specification, there have been disclosed typical preferred embodiments of the invention and, That which is claimed is:

1. A vertical insulated-gate field effect transistor, comprising:
   a semiconductor substrate;
   a gate electrode on a first surface of said semiconductor substrate, said gate electrode having an at least eight-sided opening extending therethrough, which defines at least eight sidewalls thereof, said at least eight sidewalls comprising a first plurality of sidewalls that are flat relative to a center of the opening and second plurality of sidewalls that are either flat or concave relative to the center of the opening; and
   a source electrode extending into the opening in said gate electrode.

2. The transistor of claim 1, wherein said semiconductor substrate comprises a base region therein extending opposite said gate electrode; and wherein said source electrode is electrically connected to the base region.

3. The transistor of claim 1, further comprising a drain electrode on a second surface of said semiconductor substrate, which extends opposite the first surface.

4. The transistor of claim 1, wherein all of the at least eight sidewalls are flat relative to the center of the opening.

5. The transistor of claim 4, wherein the at least eight-sided opening is in the shape of an octagon.

6. The transistor of claim 1, wherein said gate electrode comprises a quad-arrangement of four generally octagon-shaped gate electrode regions electrically coupled together by four generally rectangular-shaped gate electrode regions.

7. The transistor of claim 6, wherein the at least eight-sided opening is in the shape of an octagon.

8. The transistor of claim 6, wherein the at least eight-sided opening includes four flat sidewalls having a first length and four flat sidewalls having a second length unequal to the first length.

9. The transistor of claim 1, wherein the insulated-gate field effect transistor is a JBSFET.

10. The transistor of claim 9, wherein the JBSFET comprises a Schottky rectifying contact within the at least eight-sided opening.

11. A vertical insulated-gate field effect transistor, comprising:
    a semiconductor substrate;
    a gate electrode on a first surface of said semiconductor substrate, said gate electrode having an at least eight-sided opening extending therethrough, which defines at least eight sidewalls thereof that are flat or concave relative to a center of the opening; and
    a source electrode extending into the opening in said gate electrode.

12. The transistor of claim 11, wherein the at least eight sidewalls includes a plurality of arcuate-shaped sidewalls, which are concave relative to the center of the opening.

13. The transistor of claim 12, wherein centers of the plurality of arcuate-shaped sidewalls are spaced-apart from the center of the opening.

14. The transistor of claim 12, wherein the at least eight sidewalls includes a plurality of flat sidewalls.

15. The transistor of claim 11, wherein the at least eight sidewalls have equivalent lengths.

16. The transistor of claim 11, wherein the at least eight-sided opening is an octagonal-shaped opening.

17. The transistor of claim 16, wherein the insulated-gate field effect transistor is a JBSFET having a four-sided Schottky rectifying contact within the octagonal-shaped opening.

18. The transistor of claim 11, wherein the insulated-gate field effect transistor is a JBSFET having a Schottky rectifying contact within the at least eight-sided opening.

19. The transistor of claim 11, wherein said semiconductor substrate comprises a source region of first conductivity type extending adjacent the first surface thereof; and wherein a portion of said source electrode in the opening forms an ohmic contact with the source region.

20. The transistor of claim 19, wherein said semiconductor substrate comprises a base region of second conductivity type therein, which extends opposite said gate electrode and forms a P—N rectifying junction with the source region; and wherein said source electrode is electrically connected to the base region.

21. The transistor of claim 11, further comprising a drain electrode on a second surface of said semiconductor substrate, which extends opposite the first surface.

22. A silicon carbide power device, comprising:
    a semiconductor substrate;
    a two-dimensional (2D) array of vertical insulated-gate field effect transistor unit cells (IGFETs) in said semiconductor substrate, said 2D array of IGFETs having a contiguous gate electrode that spans the IGFETs therein, with each of said IGFETs having: (i) a lateral rectangular dimension of L×W, and (ii) a corresponding at least eight-sided opening extending through the contiguous gate electrode, where L is a length of an IGFET and W is a width of an IGFET as measured along a surface of said semiconductor substrate, and where each sidewall of each at least eight-sided opening is flat or concave relative to a center of its corresponding opening; and
    a source electrode extending into the openings in the contiguous gate electrode.

23. The power device of claim 22, wherein an area (A) of each of the openings in the contiguous gate electrodes is equivalent to: $0.1(L \times W) \leq A \leq 0.3(L \times W)$.

24. The power device of claim 23, wherein the IGFETs are configured as JBSFETs; and wherein an area (A) of each of the openings in the contiguous gate electrodes is equivalent to: $0.1(L \times W) \leq A \leq 0.3(L \times W)$.

25. A monolithically-integrated AC switch, comprising:
    a semiconductor substrate having first and second insulated-gate field effect transistors therein, which comprise:
    first and second spaced-apart and independently-controllable source terminals extending adjacent a first surface of said semiconductor substrate;
    a common drain electrode extending adjacent a second surface of said semiconductor substrate; and
    first and second gate electrodes on the first surface of said semiconductor substrate, said first gate electrode having an at least eight-sided first opening extending therethrough, which receives a portion of said first source terminal therein, said at least eight-sided first opening defined by at least eight sidewalls that are flat or concave relative to a center of the first opening.

26. The AC switch of claim 25, wherein said second gate electrode has an at least eight-sided second opening extending therethrough, which receives a portion of said second source terminal therein; and wherein the second opening in said second gate electrode is defined by at least eight sidewalls that are flat or concave relative to a center of the second opening.

* * * * *